United States Patent
Ishizaka et al.

(10) Patent No.: US 7,727,912 B2
(45) Date of Patent: Jun. 1, 2010

(54) METHOD OF LIGHT ENHANCED ATOMIC LAYER DEPOSITION

(75) Inventors: Tadahiro Ishizaka, Watervliet, NY (US); Frank M. Cerio, Jr., Schenectady, NY (US); Jacques Faguet, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 24 days.

(21) Appl. No.: 11/378,270

(22) Filed: Mar. 20, 2006

(65) Prior Publication Data
US 2007/0218704 A1 Sep. 20, 2007

(51) Int. Cl.
*H01L 21/469* (2006.01)
(52) U.S. Cl. .................. 438/788; 438/758; 438/776
(58) Field of Classification Search .................. 438/778
See application file for complete search history.

(56) References Cited
U.S. PATENT DOCUMENTS

| 4,693,779 | A | 9/1987 | Okuhira et al. |
| 6,305,314 | B1 | 10/2001 | Sneh et al. |
| 6,930,041 | B2 | 8/2005 | Agarwal |
| 6,943,096 | B1 * | 9/2005 | Wang et al. .................. 438/484 |
| 2005/0078462 | A1 | 4/2005 | Dando et al. |
| 2005/0175789 | A1 | 8/2005 | Helms Jr. et al. |
| 2007/0054047 | A1 * | 3/2007 | Ishizaka et al. .......... 427/248.1 |
| 2007/0082132 | A1 * | 4/2007 | Shinriki et al. ........ 427/255.394 |
| 2007/0165308 | A1 * | 7/2007 | Wang et al. .................. 359/494 |

* cited by examiner

*Primary Examiner*—Brook Kebede
*Assistant Examiner*—Tony Tran
(74) *Attorney, Agent, or Firm*—Oblon, Spivak, McClelland, Maier & Neustadt, L.L.P.

(57) ABSTRACT

A method light enhanced atomic layer deposition for forming a film on a substrate. The method includes disposing the substrate in a process chamber of a light enhanced atomic layer deposition (LEALD) system configured to perform a LEALD process; and depositing a film on the substrate using the LEALD process, where the depositing includes (a) exposing the substrate to a first process material, (b) exposing the substrate to a second process material containing a reducing agent and irradiating the substrate with a first light radiation having either no or at least partial temporal overlap with the exposing of the substrate to the second process material, (c) repeating steps (a) and (b) until the desired film has been deposited. According to one embodiment of the invention, the deposited film can be a TaCN film or a TaC film.

30 Claims, 10 Drawing Sheets

METHOD OF LIGHT ENHANCED ATOMIC LAYER DEPOSITION

FIELD OF INVENTION

The present invention relates to formation of films utilized in semiconductor device manufacturing, and more particularly to light enhanced atomic layer deposition (LEALD) of films on semiconductor substrates and devices.

BACKGROUND OF THE INVENTION

Typically, during semiconductor device manufacturing, a vapor deposition process is utilized to deposit materials along fine lines or within vias or contacts on a silicon substrate. The vapor deposition processes can include thermal chemical vapor deposition (TCVD) or plasma enhanced chemical vapor deposition (PECVD). In PECVD, plasma is utilized to alter or enhance the film deposition mechanism. For instance, plasma excitation generally allows film-forming reactions to proceed at temperatures that are significantly lower than those typically required to produce a similar film by TCVD. In addition, plasma excitation may activate film-forming chemical reactions that are not energetically or kinetically favored in thermal CVD. The chemical and physical properties of PECVD films may thus be varied over a relatively wide range by adjusting process parameters.

More recently, atomic layer deposition (ALD) and plasma enhanced atomic layer deposition (PEALD), which are forms of CVD or more generally film deposition, have emerged as a candidate for ultra-thin gate film formation in front end-of-line (FEOL) operations, as well as ultra-thin barrier layer and seed layer formation for metallization in back end-of-line (BEOL) operations. In ALD, two or more process gases are introduced alternately and sequentially in order to form a material film one monolayer (or less) at a time. Such an ALD process provides a self-limiting characteristic which has proven to provide improved uniformity and control in layer thickness, as well as conformality to features on which the layer is deposited. As in PECVD, PEALD processing is utilized to alter or enhance the film deposition mechanism. However, current PECVD and PEALD processes often suffer from contamination problems that affect the quality of the deposited films and the interfaces between the PECVD or PEALD films and other films in a manufactured device. Further, exposure of a substrate to a plasma can damage sensitive areas of a substrate. Thus plasma enhanced processes may be undesirable in some situations, and alternative processing methods are needed for improving the properties and integration of films in semiconductor devices.

SUMMARY OF THE INVENTION

Accordingly, one object of the present invention is directed to forming improved films for semiconductor device manufacturing by light enhanced atomic layer deposition (LEALD).

According to one embodiment of the invention, the films may be metal carbides, metal nitrides or metal carbonitrides, or a combination thereof, which can be used in FEOL or BEOL processes.

According to one embodiment, the films may be Ta-containing films, including TaC and TaCN films that may be utilized as diffusion barriers/liners in Cu metallization schemes.

According to one embodiment of the invention, a method is provided for processing a substrate. The method includes disposing the substrate in a process chamber of a LEALD system configured to perform a LEALD process, and depositing a film containing a metal nitride or a metal carbide film, or a combination thereof on the substrate using the LEALD process, where the depositing includes (a) exposing the substrate to a first process material, (b) exposing the substrate to a second process material comprising a reducing agent and irradiating the substrate with a first light radiation having either no or at least partial temporal overlap with the exposing of the substrate to the second process material, and (c) repeating steps (a) and (b) until the desired film has been deposited According to another embodiment of the invention, step (a) further comprises irradiating the substrate with a second light radiation having no temporal overlap with the exposing of the substrate to the first process material, and where step (b) comprises exposing the substrate to a second process material comprising a reducing agent and irradiating the substrate with a first light radiation having at least partial temporal overlap with the exposing of the substrate to the second process material.

According to yet another embodiment of the invention, the method further includes (d) exposing the substrate in the process chamber to a third light radiation following step (c), and (e) repeating steps (a)-(d) until the desired film has been deposited.

According to still another embodiment of the invention, step (a) further comprises irradiating the substrate with a second light radiation having no temporal overlap with the exposing of the substrate to the first process material, and the depositing further comprises (d) exposing the substrate in the process chamber to a third light radiation following step (c), and (e) repeating steps (a)-(d) until the film has a desired thickness.

DETAILED DESCRIPTION OF SEVERAL EMBODIMENTS

Figure 1:
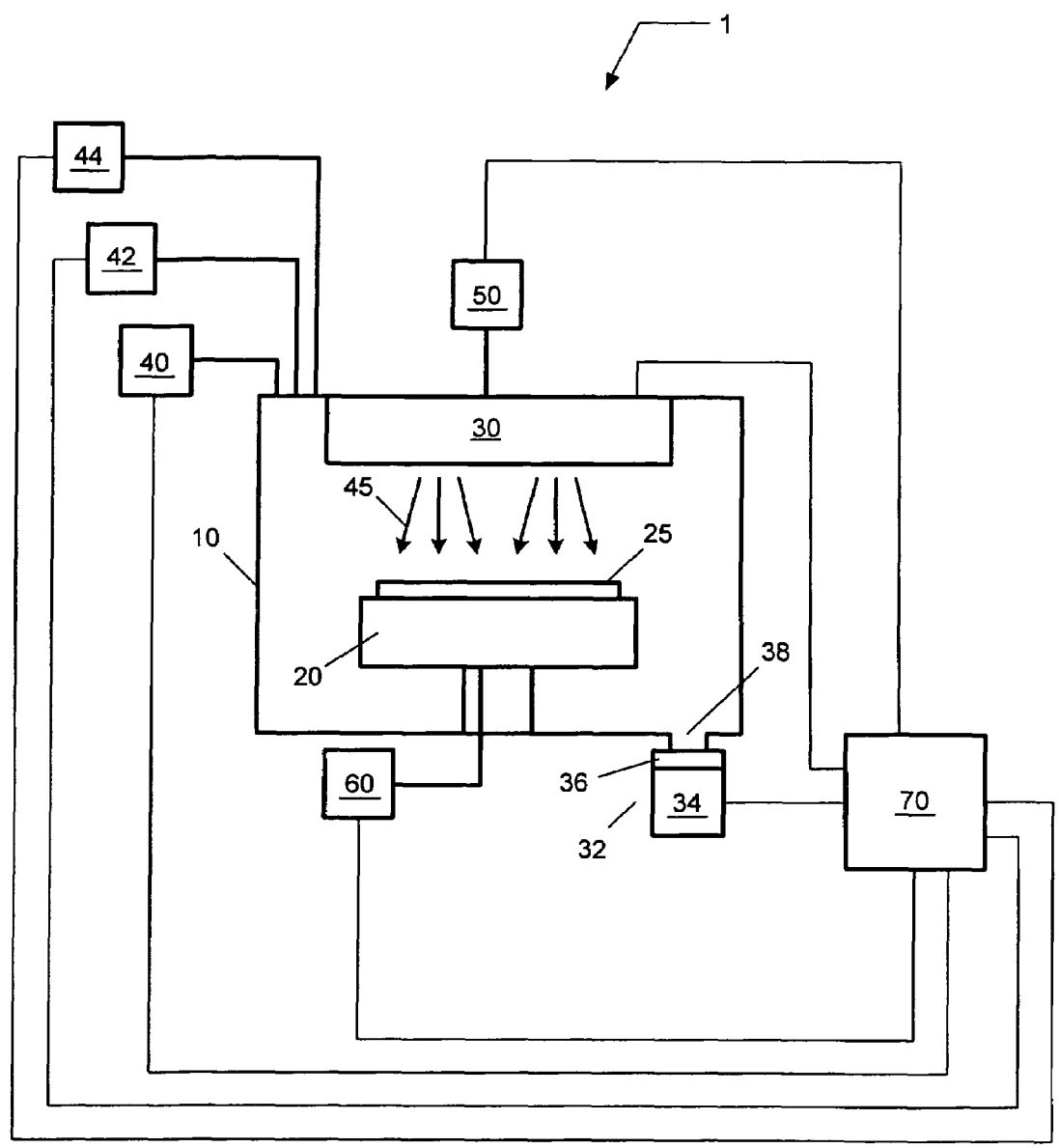
FIG. 1 depicts a schematic view of a LEALD system according to an embodiment of the invention.

As noted above, PEALD deposited films may be undesirable due to film contamination or substrate damage problems. Regarding contamination, the present inventors have recognized that the presence of impurities in films can result in poor film qualities and/or weak adhesion of the film to other films, which in turn can result in electro-migration (EM) and stress migration (SM) problems, as well as reduced device production yields. Impurities may result from an incomplete deposition process reaction and/or reaction byproducts remaining on the deposited film. This may be caused, for example, by reduced plasma exposure levels, particularly for semiconductor features such as wiring trenches or vias having high aspect ratios. Further, generation of a plasma creates energetic species that can physically bombard the substrate causing damage, particularly to sensitive gate region films.

Embodiments of the invention provide a method for depositing films on substrates and semiconductor devices by light enhanced atomic layer deposition (LEALD). In ALD processing, saturation of the reaction steps makes the film growth self-limiting which provides large area uniformity and conformality, which has important applications for deep and high aspect ratio trenches and vias on a substrate and high surface area substrates. The aspect ratio (depth/width) can be greater than or equal to about 2:1, for example 3:1, 4:1, 5:1, 6:1, 12:1, 15:1, or higher. The via can have widths of about 200 nm or less, for example 150 nm, 100 nm, 65 nm, 32 nm, 20 nm, or lower. Often, aspect ratios greater than about 5:1, for example 10:1, are referred to as "high aspect ratios". Due to the self-limiting film growth, control over the film thickness is straightforward by controlling the number of exposure cycles.

It is contemplated that LEALD processing may significantly improve film properties on the sidewalls of vias and trenches compared to PEALD processing. In particular, the present inventors have recognized that PEALD processing involves the use of highly directional ions that may not be as effective in interacting with films on the sidewalls as diffuse light irradiation. Further, light enhancement of the deposition process will reduce the energetic species that can potentially bombard the substrate, when compared to plasma processes. Still further, other characteristics of light enhancement, such as a more uniform film exposure, may improve the characteristics of the feature films.

U.S. Patent Publication 2005/0175789 discloses a method of energy assisted deposition and removal of high-k gate dielectric films. However, the processes disclosed therein are not well suited for other applications. For example, the processes of the above publication deal exclusively with deposition of metal-oxides, which are unsuitable as conductive gate films in FEOL operations, or as barrier or adhesion layers in BEOL operations. Moreover, deposition of the high-k films requires pre-treatment of the substrate for optimal deposition conditions, which provides added process steps. Still further, the processes of the above publication require exposing the substrate to electromagnetic energy to facilitate each and every process material reaction on the substrate, which may result in undesirable dissociation of process materials before adsorption, and/or when light exposure follows gas injection, unnecessarily long deposition cycles which reduce the deposition rate.

According to one embodiment of the invention, the method includes disposing a substrate in a process chamber of a LEALD system configured to perform a LEALD process, and depositing a film on the substrate using the LEALD process. The LEALD process includes exposing the substrate to a first process material to adsorb a layer containing the first process material on the substrate. Excess first process material is removed by purging the process chamber with a purge gas. Following the purging, the substrate is exposed to a second process material containing a reducing agent where the substrate is irradiated with a first light radiation having either no or at least partial temporal overlap (a period of time in which activities from different actions occur simultaneously) with the exposing of the substrate to the second process material. The second process material reacts with the adsorbed layer containing the first process material to form an atomic layer of material on the substrate. Excess second process material is removed by purging the process chamber with a purge gas. This sequence of steps may be repeated any number of times until the desired film has been deposited on the substrate.

The deposited films may contain metals and metal-containing materials such as metal nitrides, metal oxides, metal carbides, or metal carbonitrides or a combination thereof. Preferably, the deposited film includes metal carbide, metal nitride, or metal carbonitride. The metal element in these films can, for example, include Ti, Zr, Y, La, Nb, Ta, W, Zn, Al, Sn, Ce, Pr, Sm, Eu, Tb, Dy, Ho, Er, Tm, Yb, and Lu. According to one embodiment of the invention, the metal-containing film may contain a Ta-containing material such as TaCN or TaC that may be utilized as diffusion barriers/liners in Cu metallization schemes.

The light radiation steps of embodiments of the invention, may include light radiation with a wide variety of wavelengths from the electromagnetic spectrum. Examples include, but are not limited to, in order of decreasing energy, vacuum ultraviolet (VUV) light, ultraviolet (UV) light, visible light, or infrared (IR) light, or a combination of two or more thereof. In a preferred embodiment, the wavelength of energy used to enhance the deposition process is selected such that typical plasma-like conditions with electron and ion densities of about $10^{10}/cm^3$ will not be formed in the process chamber, in order to minimize the undesirable characteristics of plasma processing noted above. Further, as those skilled in the art will readily recognize, the light energy may be chosen to facilitate the desired reaction on a substrate. The light energy that is chosen can, for example, depend on the energy needed to dissociate an adsorbed layer containing the first process material on the substrate and/or the energy needed to excited the second process material containing a reducing agent. The light radiation may, for example, be supplied by a laser light source or by a lamp light source capable of providing discrete light wavelengths or broadband light. In one example, the light radiation may be supplied by an array of lamp light sources. Suitable light intensity levels that enable formation of films by LEALD at improved deposition rates and with reduced impurities can be determined by direct experimentation and/or design of experiments (DOE). Other adjustable process parameters such as substrate temperature, process pressure, type of first and second process materials and relative gas flows can also be determined by direct experimentation and/or DOE.

Embodiments of the invention enable film-forming reactions to proceed at temperatures that are significantly lower than those typically required to produce a similar film by TCVD. The desired film-forming reactions may not be energetically or kinetically favored in TCVD and the use of LEALD allows for varying the chemical and physical properties of deposited films over a relatively wide range by adjusting process parameters such as substrate temperature and process chamber pressure. According to one embodiment of the invention, the substrate temperature can be between room temperature and about 600° C. According to another embodiment of the invention, the substrate temperature can be between about 200° C. and about 500° C. According to yet another embodiment of the invention, the substrate temperature can be between about 300° C. and about 400° C. The LEALD processing is carried out while maintaining the process chamber pressure below atmospheric pressure, for example between about 1 mTorr and about 760 Torr. In another example, the process chamber pressure may be between about 10 mTorr and about 10 Torr during the LEALD processing.

In the following description, in order to facilitate a thorough understanding of the invention and for purposes of explanation and not limitation, specific details are set forth, such as a particular geometry of the exemplary LEALD systems depicted and descriptions of various components. However, it should be understood that the invention may be practiced in other embodiments that depart from these specific details. In particular, a variety of other LEALD system designs and configurations that contain a light source may be utilized.

Referring now to the drawings, FIG. 1 illustrates a LEALD system 1 for depositing a film on a substrate according to one embodiment of the invention. For example, during the metallization of inter-connect and intra-connect structures for semiconductor devices in back-end-of-line (BEOL) operations, a thin conformal Ta-containing film may be deposited on wiring trenches or vias to minimize the migration of metal into the inter-level or intra-level dielectric, where the Ta-containing film provides acceptable adhesion to the dielectric and a Cu seed layer deposited on the Ta-containing film for subsequent metallization. Further, during gate formation on a gate dielectric in front-end-of-line (FEOL) operations, a coating of metal carbides, metal nitrides, or metal carbonitrides may be formed.

The LEALD system 1 includes a process chamber 10 having a substrate holder 20 configured to support a substrate 25, upon which the film is formed. The process chamber 10 further comprises a radiation assembly 30 containing a light source for irradiating the substrate 25 with VUV light, UV light, visible light, or IR light, or a combination of two or more thereof. The light source may be a device such as a laser or a lamp. The radiation assembly 30 can be configured to irradiate the whole surface of the substrate 25 facing the radiation assembly 30 or the light focused to irradiate only a portion of the surface 25. Additionally, the LEALD system 1 contains a power source 50 coupled to the radiation assembly 30. Coupled to the process chamber 10 are a first process material supply system 40, a second process material supply system 42, and a purge gas supply system 44. Although not shown in FIG. 1, the LEALD system 1 may contain a showerhead gas injection plate or an annular ring with a plurality of holes for introducing gases into the process chamber 10. The first material supply system 40, the second material supply system 42, and the purge gas supply system 44 can include one or more material sources, one or more pressure control devices, one or more flow control devices, one or more filters, one or more valves, or one or more flow sensors. The flow control devices can include pneumatic driven valves, electro-mechanical (solenoidal) valves, and/or high-rate pulsed gas injection valves.

The radiation assembly 30 in FIG. 1 is configured to expose the substrate 25 to diffuse light radiation 45 that is nearly isotropic (i.e., not strongly directional). In other words, the diffuse light radiation 45 is not predominantly incident to the substrate 25 from any particular direction. It is contemplated that diffuse light radiation may be more effective than collimated light radiation in altering or enhancing the film deposition mechanism in vias and trenches formed in substrates, particularly in high aspect ratio vias and trenches where the use of collimated light radiation can result in low irradiation levels of the sidewalls of the vias and trenches. Radiation assemblies capable of producing diffuse light radiation are well known to those skilled in the art. For example, the radiation assembly 30 can be capable of generating an output between about 10 mW/cm$^2$ and about 1000 mW/cm$^2$. According to another embodiment of the invention, the output can be between about 50 mW/cm$^2$ and about 500 mW/cm$^2$.

Although not shown in FIG. 1, the radiation assembly 30 may contain a plurality of light sources for providing a wide variety of wavelengths from the electromagnetic spectrum, either simultaneously or sequentially. In one example, the radiation assembly 30, may provide UV light and IR light. The radiation assembly 30 is preferably configured to permit light pulsing, or a shutter may be positioned between the radiation assembly 30 and the substrate 25 to permit irradiation of the substrate 25 by opening and closing the shutter.

Furthermore, the LEALD system 1 includes a controller 70 that can be coupled to process chamber 10, substrate holder 20, radiation assembly 30, first process material supply system 40, second process material supply system 42, purge gas supply system 44, first power source 50, and substrate temperature control system 60.

Alternatively, or in addition, controller 70 can be coupled to one or more additional controllers/computers (not shown), and controller 70 can obtain setup and/or configuration information from an additional controller/computer.

In FIG. 1, singular processing elements (10, 20, 30, 40, 42, 44, 50, and 60) are shown, but this is not required for the invention. The LEALD system 1 can include any number of processing elements having any number of controllers associated with them in addition to independent processing elements.

The controller 70 can be used to configure any number of processing elements (10, 20, 30, 40, 42, 44, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 1, the LEALD system 1 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

The first process material supply system 40 and the second process material supply system 42 are configured to alternately introduce a first process material to process chamber 10 and a second process material to process chamber 10. The alternation of the introduction of the first material and the introduction of the second material can be cyclical, or it may be acyclical with variable time periods between introduction of the first and second materials. The first process material can, for example, be selected from a wide variety of metal precursors, including metal precursors containing Ti, Zr, Y, La, Nb, Ta, W, Zn, Al, Sn, Ce, Pr, Sm, Eu, Tb, Dy, Ho, Er, Tm, Yb, or Lu. In one example, the metal precursor can contain tantalum in the form of a Ta film precursor for forming a TaC or TaCN film. The Ta film precursor can contain the principal atomic or molecular species found in a TaC or TaCN film formed on substrate 25. For instance, the Ta film precursor can originate as a solid phase, a liquid phase, or a gaseous phase, and it may be delivered to process chamber 10 in a gaseous phase with or without the use of a carrier gas. The second process material contains a reducing agent, which may also include atomic or molecular species found in the film formed on substrate 25. For instance, the reducing agent can originate as a solid phase, a liquid phase, or a gaseous phase, and it may be delivered to process chamber 10 in a gaseous phase with or without the use of a carrier gas. According to an embodiment of the invention, the second process material can include a reducing agent, such as hydrogen ($H_2$) gas, ammonia ($NH_3$), $N_2H_4$, $NH(CH_3)_2$, $N_2H_3CH_3$, diborane ($B_2H_6$), silane ($SiH_4$), or disilane ($Si_2H_6$), or a combination of one or more thereof. Thus, the second process material may include a material (such as N or C) that forms a part of the deposited film, or materials that provide a reduction reaction without contributing to the deposited film (such as $H_2$, for example).

Additionally, the purge gas supply system 44 can be configured to introduce a purge gas to process chamber 10. For example, the introduction of purge gas may occur between introduction of the first process material and the second process material to process chamber 10, or following the introduction of the second process material to process chamber 10, respectively. The purge gas can comprise an inert gas, such as a noble gas (i.e., helium, neon, argon, xenon, krypton), or nitrogen ($N_2$), or hydrogen ($H_2$). Although not shown in FIG. 1, the purge gas supply system 44 may be further configured for purging a light transparent window (not shown) of the radiation assembly 30 in the process chamber 10 that faces the substrate 25. The light transmissive window transmits the diffuse light radiation 45 and, in the absence of a purge, may become coated from the process being performed in the process chamber 10, thereby reducing the intensity of the diffuse radiation 45 that reaches the substrate 25. In FIG. 1, the radiation assembly 30 is shown disposed in the process chamber 10 but this is not required for embodiments of the invention as the radiation assembly 30 may be provided outside the process chamber and a light transmissive window utilized to transmit the diffuse light radiation and provide a vacuum seal between the atmosphere and the vacuum environment inside the process chamber 10.

Additionally, the LEALD system 1 includes a substrate temperature control system 60 coupled to substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be included in the substrate holder 20, as well as the chamber wall of the process chamber 10 and any other component within the LEALD system 1.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the thin film on substrate 25, and suitable for use of the first and second process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. Moreover, a device for monitoring chamber pressure (not shown) can be coupled to the process chamber 10. The pressure measuring device can be, for example, a Type 628B Baratron absolute capacitance manometer commercially available from MKS Instruments, Inc. (Andover, Mass.).

Still referring to FIG. 1 controller 70 can comprise a microprocessor, memory, and a digital I/O port capable of generating control voltages sufficient to communicate and activate inputs to deposition system 1 as well as monitor outputs from LEALD system 1. Moreover, the controller 70 may be coupled to and may exchange information with the process chamber 10, substrate holder 20, upper assembly 30, first process material supply system 40, second process material supply system 42, purge gas supply system 44, power source 50, substrate temperature controller 60, and pressure control system 32. For example, a program stored in the memory may be utilized to activate the inputs to the aforementioned components of the deposition system 1 according to a process recipe in order to perform an etching process, or a deposition process. One example of the controller 70 is a DELL PRECISION WORKSTATION 610™, available from Dell Corporation, Austin, Tex.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the LEALD system 1, or it may be remotely located relative to the LEALD system 1. For example, the controller 70 may exchange data with the LEALD system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the LEALD 1 via a wireless connection.

Figure 2:
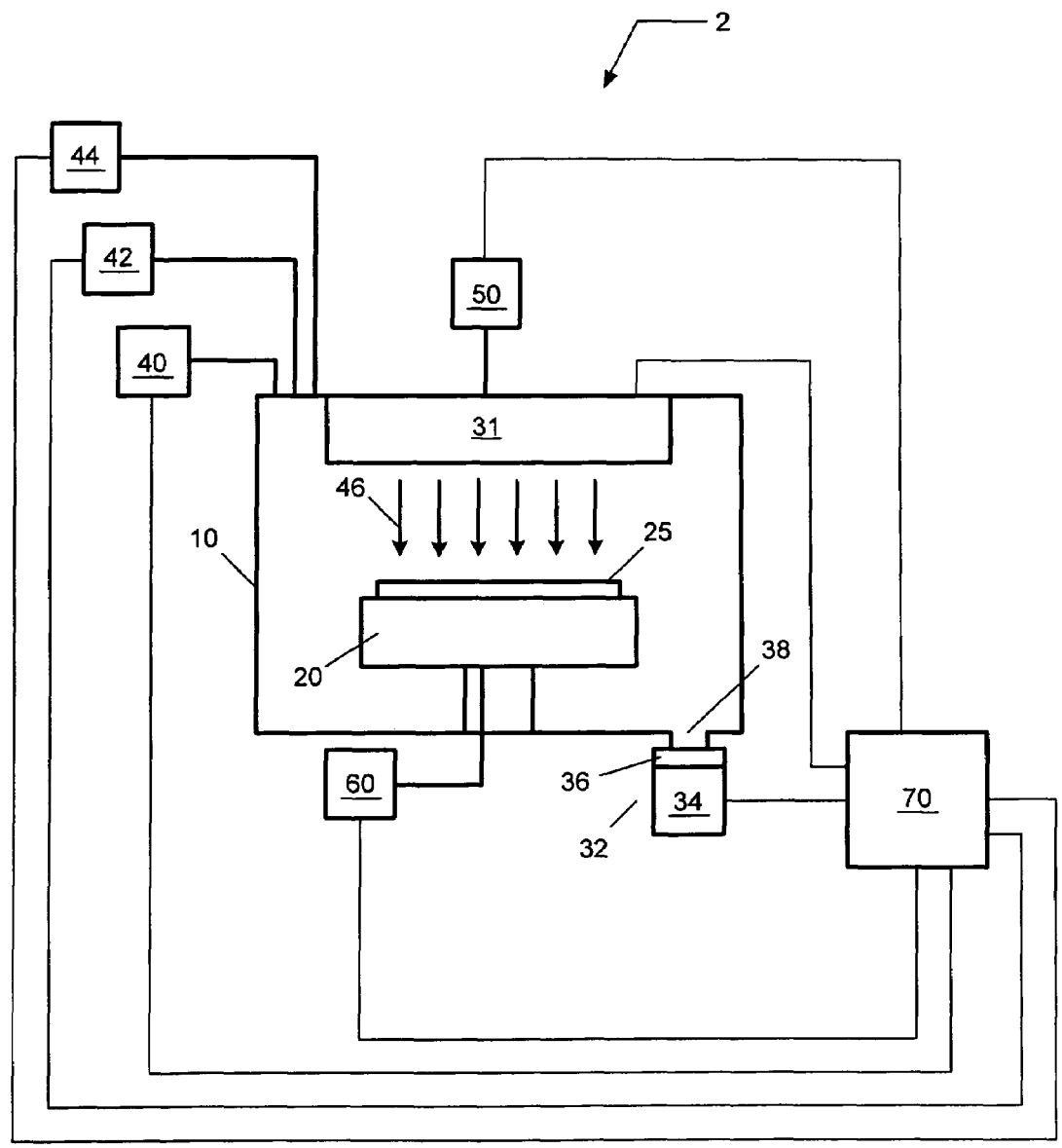
FIG. 2 depicts a schematic view of another LEALD system according to an embodiment of the invention.

FIG. 2 depicts a schematic view of another LEALD system according to an embodiment of the invention. The processing system 2 depicted in FIG. 2 is similar to the processing system 1 depicted in FIG. 1 but contains a radiation assembly 31 configured to form and expose the substrate 25 to collimated light radiation 46 having light rays that are substantially parallel to each other. Radiation assemblies capable of producing collimated light radiation are well known to those skilled in the art. For example, the collimated light radiation 46 can be formed by collimating diffuse light radiation from one or more light radiation sources housed in the radiation assembly 31 using a condenser lens, or other devices such as one or more baffles. For example, the radiation assembly 31 can be capable of generating an output between about 10 mW/cm$^2$ and about 1000 mW/cm$^2$. According to another embodiment of the invention, the output can be between about 50 mW/cm$^2$ and about 500 mW/cm$^2$. According to an embodiment of the invention, the collimated light radiation 46 can contain VUV light, UV light, visible light, or IR light, or a combination of two or more thereof.

According to one embodiment of the invention, the first process material and the second process material are chosen according to the elemental composition and characteristics of the film to be deposited on the substrate. In the example of a TaCN film, the first process material can include a Ta organic film precursor containing a "Ta—N—C" structural unit, such as tertiary amyl imido-tris-dimethylamido tantalum (Ta(NC (CH$_3$)$_2$C$_2$H$_5$)(N(CH$_3$)$_2$)$_3$, hereinafter referred to as TAIMATA®. In another example, the first process material can include (pentakis(diethylamido) tantalum (Ta[N(C$_2$H$_5$)$_2$]$_5$, PDEAT), pentakis(ethylmethylamido) tantalum (Ta[N(C$_2$H$_5$CH$_3$)]$_5$, PEMAT), pentakis(mehylamido) tantalum (Ta[N(CH$_3$)$_2$]$_5$, PDMAT), (t-butylimino tris(diethylamino) tantalum (Ta(NC(CH$_3$)$_3$)(N(C$_2$H$_5$)$_2$)$_3$, TBTDET), Ta(NC$_2$H$_5$)(N(C$_2$H$_5$)$_2$)$_3$, Ta(NC(CH$_3$)$_3$)(N(CH$_3$)$_2$)$_3$, or tert-butyl-tris-ethylmethylamido tantalum Ta(NC(CH$_3$)$_3$) ((NC$_2$H$_5$(CH$_3$)$_3$)$_3$), TBTEMAT).

According to another embodiment of the invention, the first process material and the second process material are chosen according to the elemental composition and characteristics of a TaC film to be deposited on the substrate. The first process material can include a Ta organic film precursor containing a "Ta—C" structural unit, such as Ta($\eta^5$-C$_5$H$_5$)$_2$H$_3$, Ta(CH$_2$) (CH$_3$)($\eta^5$-C$_5$H$_5$)$_2$, Ta($\eta^3$-C$_3$H$_5$) ($\eta^5$-C$_5$H$_5$)$_2$, Ta(CH$_3$)$_3$($\eta^5$-C$_5$H$_5$)$_2$, Ta(CH$_3$)$_4$($\eta^5$-C$_5$(CH$_3$)$_5$), or Ta($\eta^5$-C$_5$(CH$_3$)$_5$)$_2$H$_3$.

According to an embodiment of the invention, the second process material can include a reducing agent, such as hydrogen (H$_2$) gas, ammonia (NH$_3$), N$_2$H$_4$, NH(CH$_3$)$_2$, N$_2$H$_3$CH$_3$, diborane (B$_2$H$_6$), silane (SiH$_4$), or disilane (Si$_2$H$_6$), or a combination of one or more thereof.

Figure 3A:
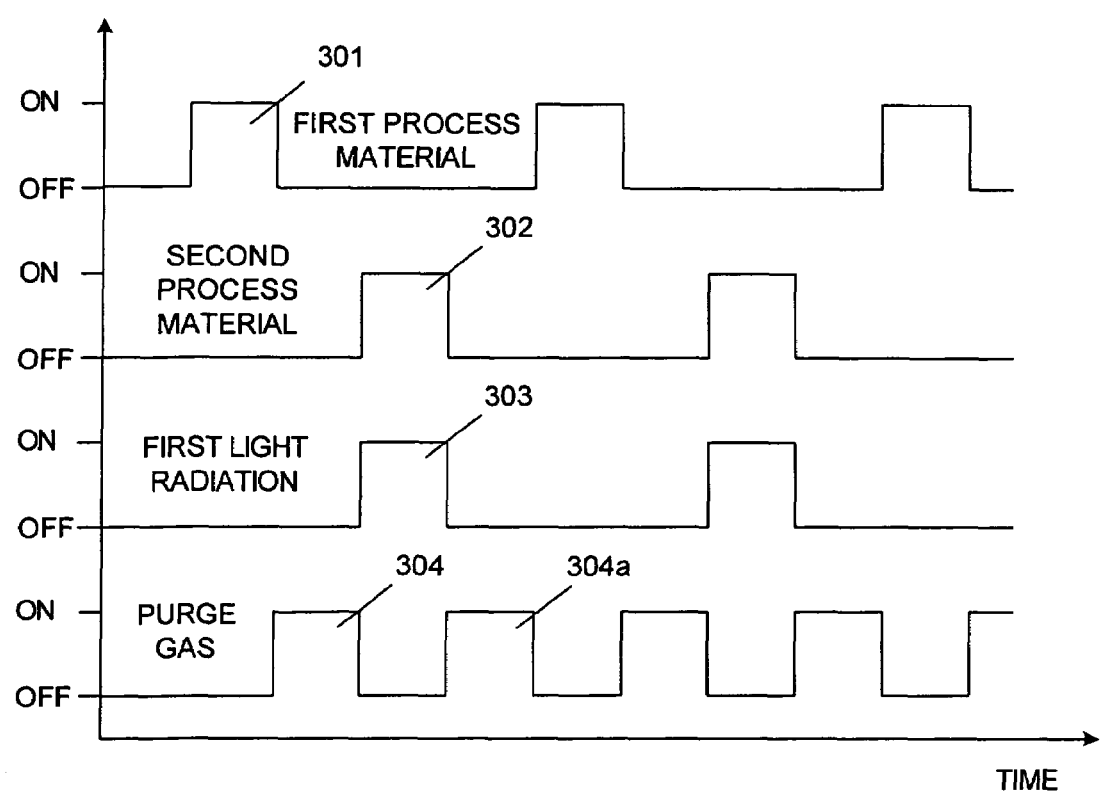
FIGS. 3A and 3B depict a timing diagram and process flow diagram for a LEALD process for forming a film on a substrate according to an embodiment of the invention.
Figure 3B:
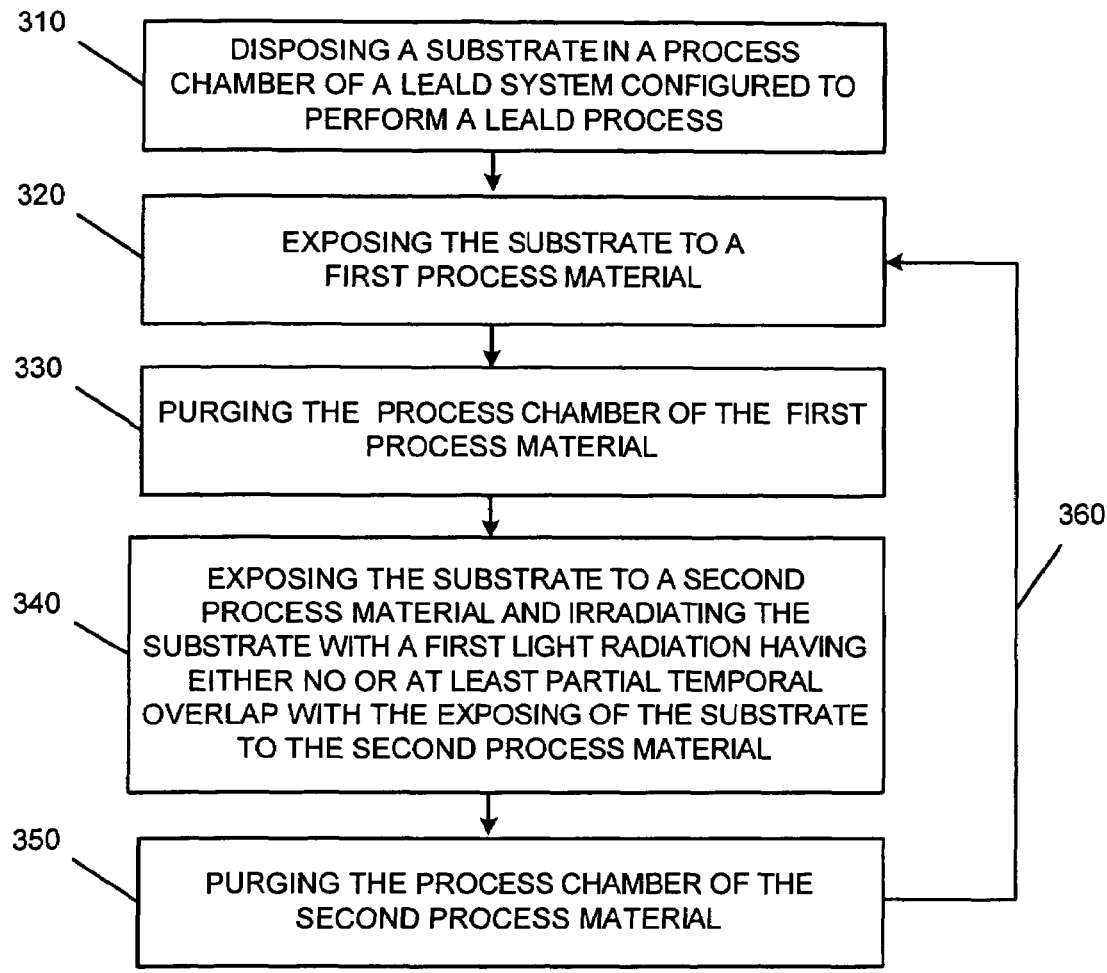

FIGS. 3A and 3B depict a timing diagram and process flow diagram for a LEALD process for forming a film on a substrate according to an embodiment of the invention. In step 310, a substrate is disposed in the process chamber of a LEALD system configured to perform the LEALD process. Preferably, the LEALD process is a BEOL process such as forming a film on a feature of the substrate having a sidewall, however, the inventive process may be used for FEOL operations as discussed above. The LEALD process can, for example, be performed in process chamber 10 of LEALD systems 1, 2 shown in FIGS. 1, 2. The substrate can, for example, be a 200 mm wafer or a 300 mm wafer, or an even larger-sized wafer.

In step 320, the substrate is exposed to a first process material containing a film precursor. The first process material is introduced to the process chamber for time period 301 in order to cause adsorption of the film precursor on exposed surfaces of the substrate. During the time period 301, the film precursor may be saturatively chemisorbed on the substrate. In the embodiment depicted in FIGS. 3A and 3B, the film precursor is thermally adsorbed on the exposed surfaces of the substrate without any exposure to light radiation. The present inventors have recognized that adsorption of the first process material to the substrate surface without light exposure provides good self limiting properties that allow a thin conformal monolayer (or less) of material to be adsorbed, whereas exposure to light causes excitation and dissociation of the first process material above the substrate, which can adversely affect the self-limiting process. As described above, a tantalum film precursor can enable formation of a TaC film or a TaCN film on the substrate. The first process material may be delivered "neat" (undiluted by a carrier gas) to the process chamber or a carrier gas may be used to dilute the first process material. The carrier gas can, for example, include Ar or N$_2$. According to one embodiment of the invention, the first process material can be undiluted TAIMATA that is vaporized from TAIMATA liquid.

In step 330, the process chamber is purged with a purge gas for a time period 304. As described above, the purge gas can, for example, contain Ar or $N_2$. The length of time period 304 can, for example, be between 1 sec and 20 sec, or between 2 sec and 10 sec.

In step 340, the substrate is exposed to a second process material containing a reducing agent for a time period 302 and the substrate irradiated with a first light radiation having either no or at least partial temporal overlap with the exposing of the substrate to the second process material. In the exemplary embodiment schematically shown in FIG. 3A, the exposing time period 302 and the irradiating time period 303 fully overlap in time. Although the second process material exposure time period 302 and the irradiation time period 303 are shown in FIG. 3 to exactly correspond to one another, according to one embodiment of the invention, the exposing time period 302 and the irradiating time period 303 may only partially overlap in time or have no overlap at all.

In step 340, the first light radiation can cause ionization and/or dissociation of the reducing agent in the second process material in the gas phase and/or on the substrate surface. The radicals and/or ions that are formed can chemically react with the first process material and/or the second process material adsorbed on the substrate. In addition, or in the alternative, the first light radiation can cause activation (e.g., through heating or partial decomposition) of the first process material adsorbed on the substrate. When the substrate is heated to an elevated temperature by the substrate holder upon which the substrate resides and/or by the first light radiation, the surface chemical reaction facilitates the formation of the desired film.

In step 350, the process chamber is purged with a purge gas for a time period 304a. The length of time periods 304 and 304a can be the same or, alternately, time periods 304 and 304a can have different lengths. The length of time period 304b can, for example, be between 1 sec and 20 sec, or between 2 sec and 10 sec. Purging steps 330 and 350 ensure that the reduction reaction occurs primarily at the adsorbed layer of the first process material on the substrate, rather than in the process chamber gaseous environment prior to being deposited.

The reduction reaction completed by step 350 results in a thin layer being deposited on the substrate surface. The thin layer can have an average thickness of about one atomic layer, or less. According to an embodiment of the invention, steps 310-350 may be repeated any number of times until a desired film is deposited as schematically shown by process flow arrow 360 in FIG. 3B. As used herein "a desired film" is not necessarily the final completed film to be deposited, but rather indicates that the repeating of ALD steps is interrupted by some other process step, such as a further light exposure step as described below. In one example, the steps 310-350 may be repeated between 1 and 100 times, or between 30 and 70 times, to produce a final film with a desired thickness on the substrate. The thickness of the film can, for example, be between 0.5 nm and 20 nm, or between 1 nm and 10 nm.

Figure 4A:
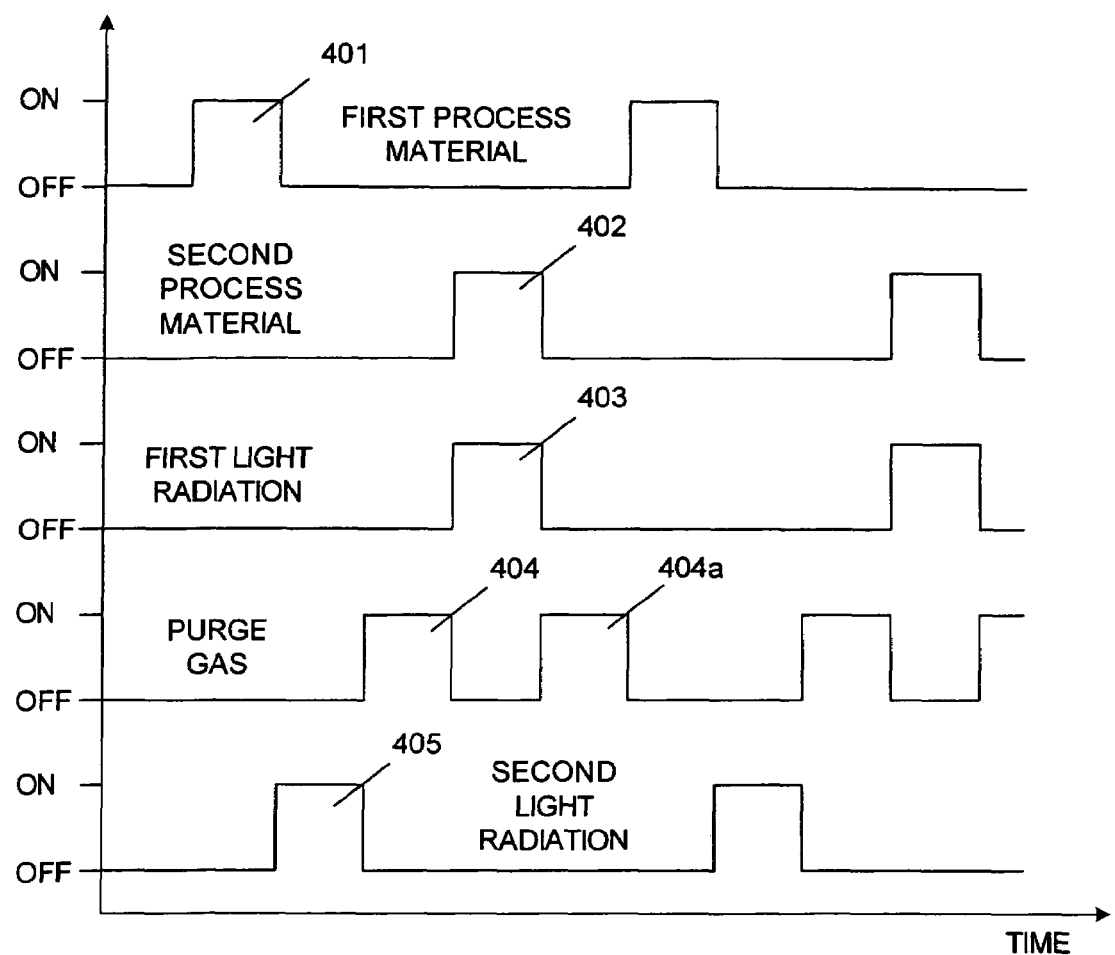
FIGS. 4A and 4B depict a timing diagram and process flow diagram for a LEALD process for forming a film on a substrate according to another embodiment of the invention.
Figure 4B:
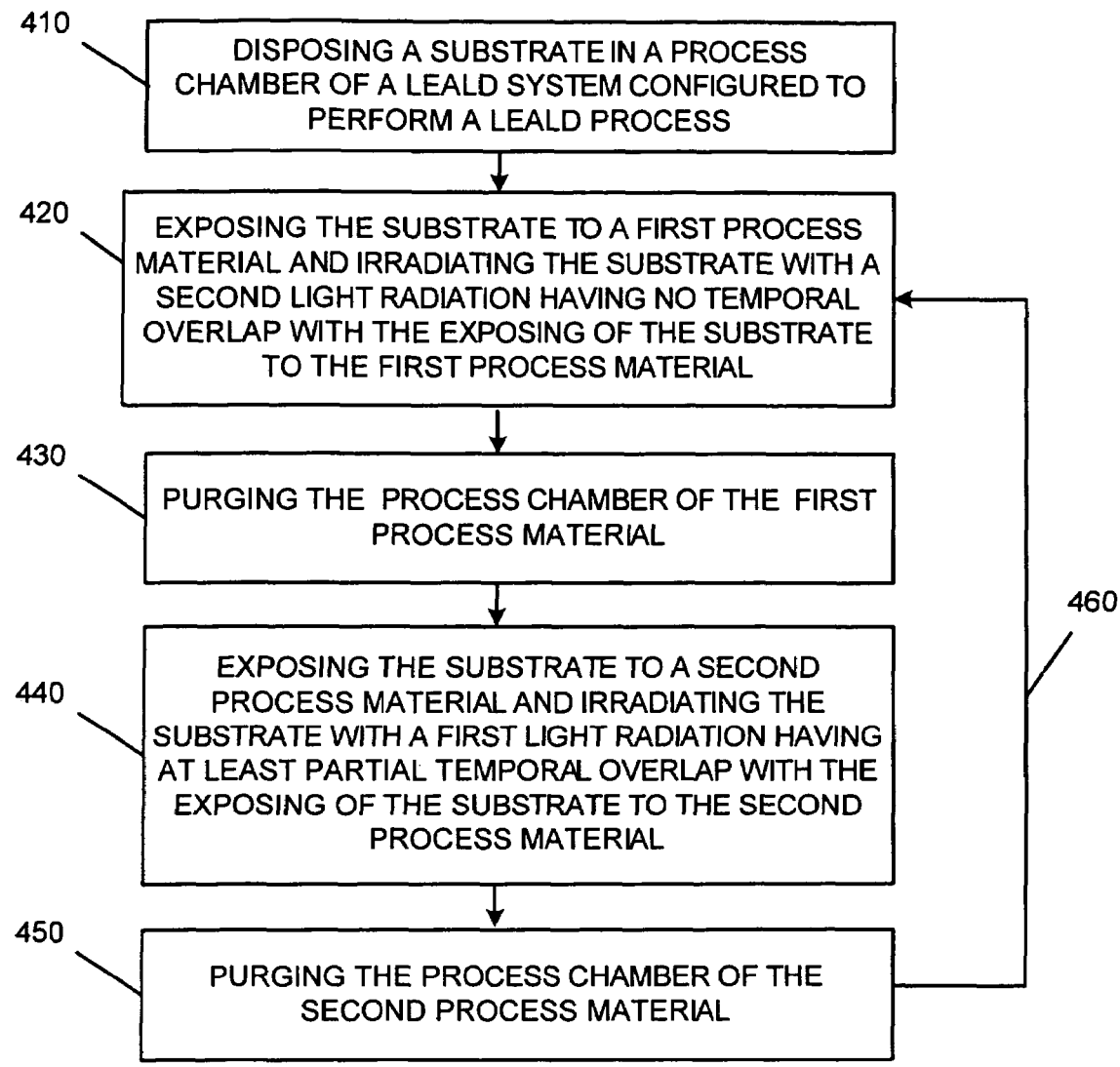

FIGS. 4A and 4B depict a timing diagram and process flow diagram for a LEALD process for forming a film on a substrate according to another embodiment of the invention. The timing diagram of FIG. 4A is similar to that of FIG. 3A, where time periods 401, 402, 403, 404, and 404a are similar or the same as time periods 301, 302, 303, 304, 304a, respectively. Furthermore, the process flow diagram 4B is similar to that of FIG. 3B, where steps 410, 430, 450, and 460, are similar or the same as steps 310, 330, 350, and 360, respectively. Step 420 is similar to step 320, but step 420 includes exposing the substrate for a first process material and irradiating the substrate with a second light radiation having no temporal overlap with the exposing of the substrate to the first process material. In the embodiment schematically shown in FIG. 4A, the exposing time period 401 and the irradiating time period 405 have no temporal overlap. The present inventors have determined that while light exposure during exposing the substrate to the first process material can impede the self limiting characteristics of the ALD process as described above, irradiating the substrate to light before or after exposure to the first process material can improve film characteristics by completing the reactions of residual unreacted process gasses on the substrate surface for example.

Step 440 is similar to step 340, but step 440 includes exposing the substrate to a second process material and irradiating the substrate with a first light radiation having at least partial temporal overlap with the exposing of the substrate to the second process material. Although the second process material exposure time period 402 and the irradiation time period 403 are shown to exactly correspond to one another in FIG. 4A, they may only partially overlap in time. According to one embodiment of the invention, the first and second light radiation may have the same wavelength range and the same power. Alternately, the first and second light radiation may vary in wavelength range and/or in power.

According to an embodiment of the invention, steps 410-450 may be repeated any number of times until a desired film is formed as depicted by process flow arrow 460. For example, the steps 410-450 may be repeated between 1 and 100 times, or between 30 and 70 times, to produce a final film with a desired thickness on the substrate. The thickness of the film can, for example, be between 0.5 nm and about 20 nm, or between 1 nm and about 10 nm.

Figure 5A:
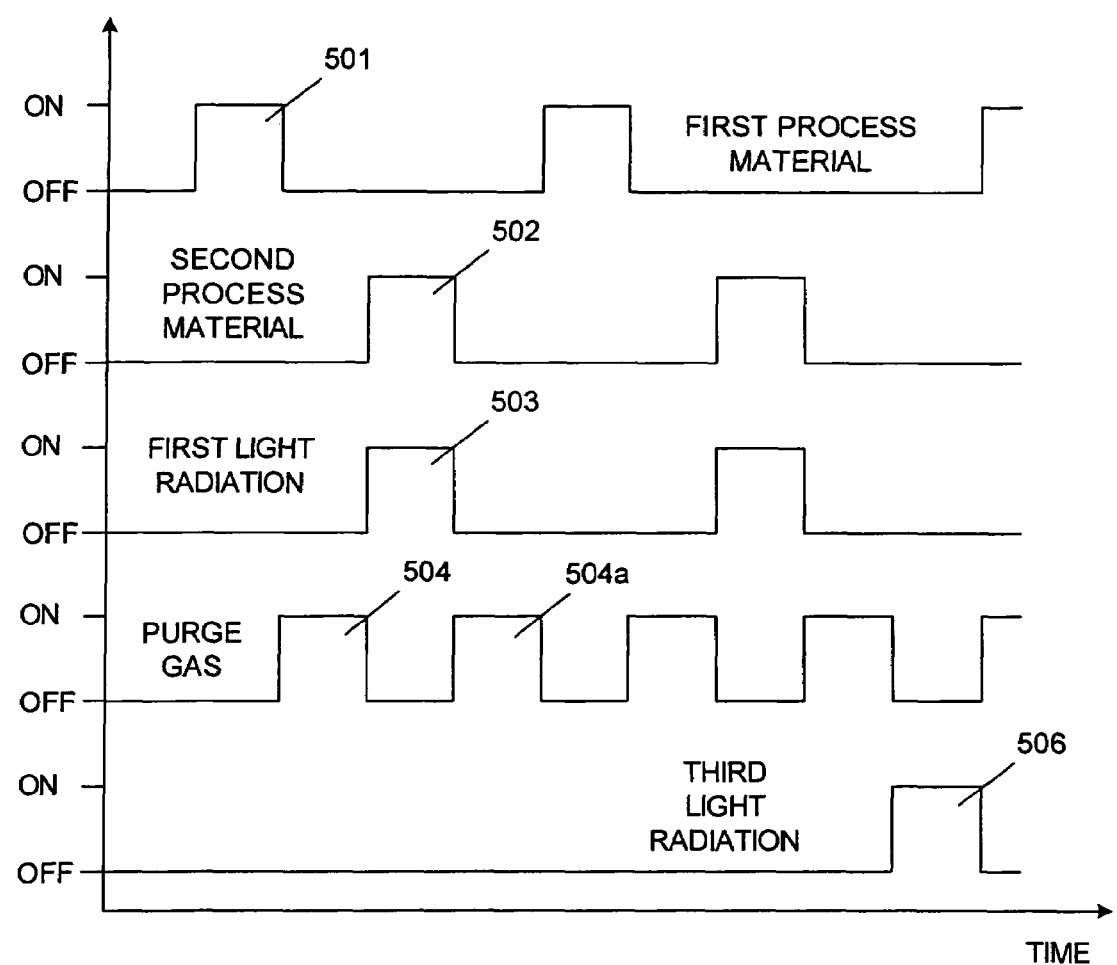
FIGS. 5A and 5B depict a timing diagram and process flow diagram for a LEALD process for forming a film on a substrate according to still another embodiment of the invention.
Figure 5B:
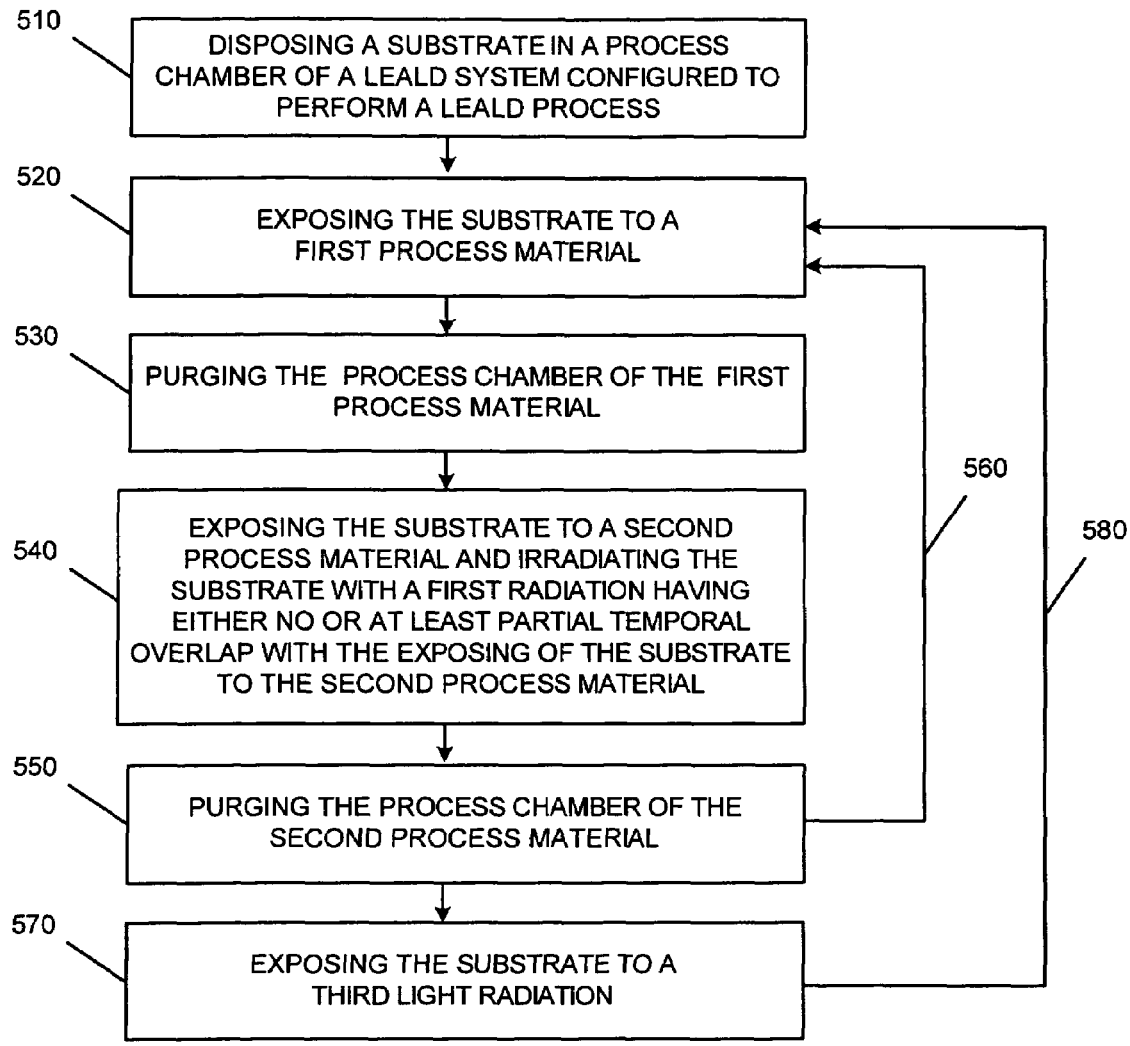

FIGS. 5A and 5B depict a timing diagram and process flow diagram for a LEALD process for forming a film on a substrate according to another embodiment of the invention. The timing diagram of FIG. 5A is similar to that of FIG. 3A, where time periods 501, 502, 503, 504, and 504a are similar or the same as time periods 301, 302, 303, 304, 304a, respectively. Furthermore, the process flow diagram 5B is similar to that of FIG. 3B, where steps 510, 520, 530, 540, 550, and 560, are similar of the same as steps 310, 320, 330, 340, 350, and 360, respectively. The embodiment depicted in FIGS. 5A and 5B further contains a step 570 of exposing the substrate to a third light radiation for a time period 506 following step 550. According to one embodiment of the invention, step 570 can be performed while no gas is flowed into the process chamber. According to one embodiment of the invention, the first, second, and third light radiation may have the same wavelength range and the same power. Alternately, they may vary in wavelength range and/or in power.

This third light exposure step 570 can further assist in completing film formation and removing reaction by products from the film surface. In the case of Ta-containing films, it is contemplated that the irradiating step 570 may improve adhesion between the substrate and the Ta-containing film and/or between the Ta-containing film and a Cu metal seed layer deposited on the Ta-containing film for subsequent metallization. It is expected that the improved adhesion may result from removal of surface contamination such as carbon (C), nitrogen (N), oxygen (O), or water ($H_2O$), generation of free (active) Ta sites on the surface of the Ta-containing film, atomic level roughening of the Ta-containing film, increase in the density of the Ta-containing film, increase in the crystallinity of the Ta-containing film, or a combination of two or more thereof. These effects may be caused by the removal of residual process materials from the substrate surface, for example.

According to an embodiment of the invention, steps 510-550 may be repeated any number of times until a desired film is formed as depicted by process flow arrow 560, for example between 1 and 100 times, or between 10 and 20 times. Furthermore, step 570 combined with steps 510-550, where steps 510-550 have been repeated a desired number of times, may also be repeated any number of times as depicted by process flow arrow 580. That is, step 570 may be intermittently performed throughout the film growth process, for example between 1 and 20 times, or between 2 and 10 times to produce a film with a desired thickness on the substrate. In one embodiment, step 570 is performed at equal intervals of repeated steps 510-550, but this is not required for the invention. The thickness of the film can, for example, be between 0.5 nm and about 20 nm, or between 1 nm and about 10 nm.

Figure 6A:
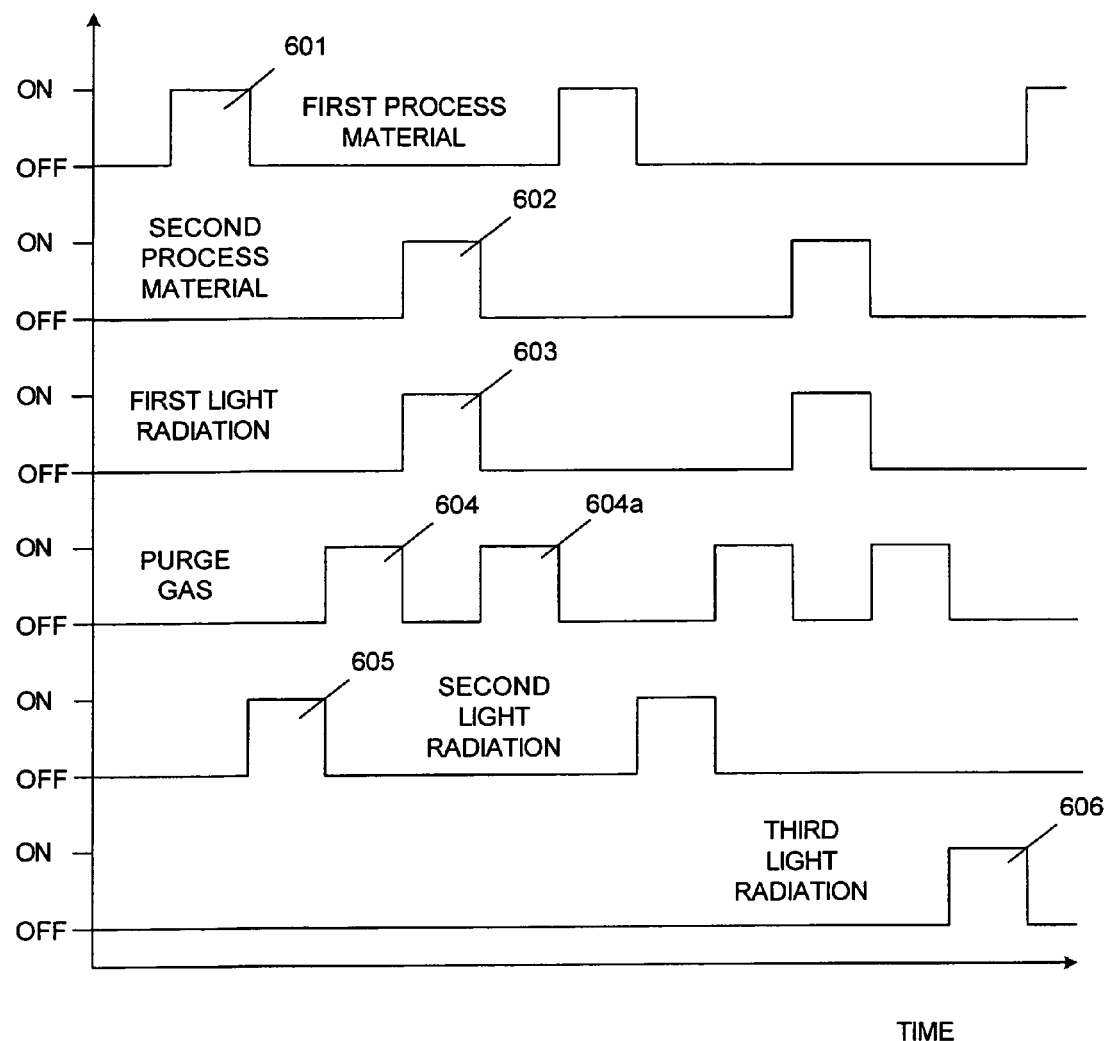
FIGS. 6A and 6B depict a timing diagram and process flow diagram for a LEALD process for forming a film on a substrate according to yet another embodiment of the invention.
Figure 6B:
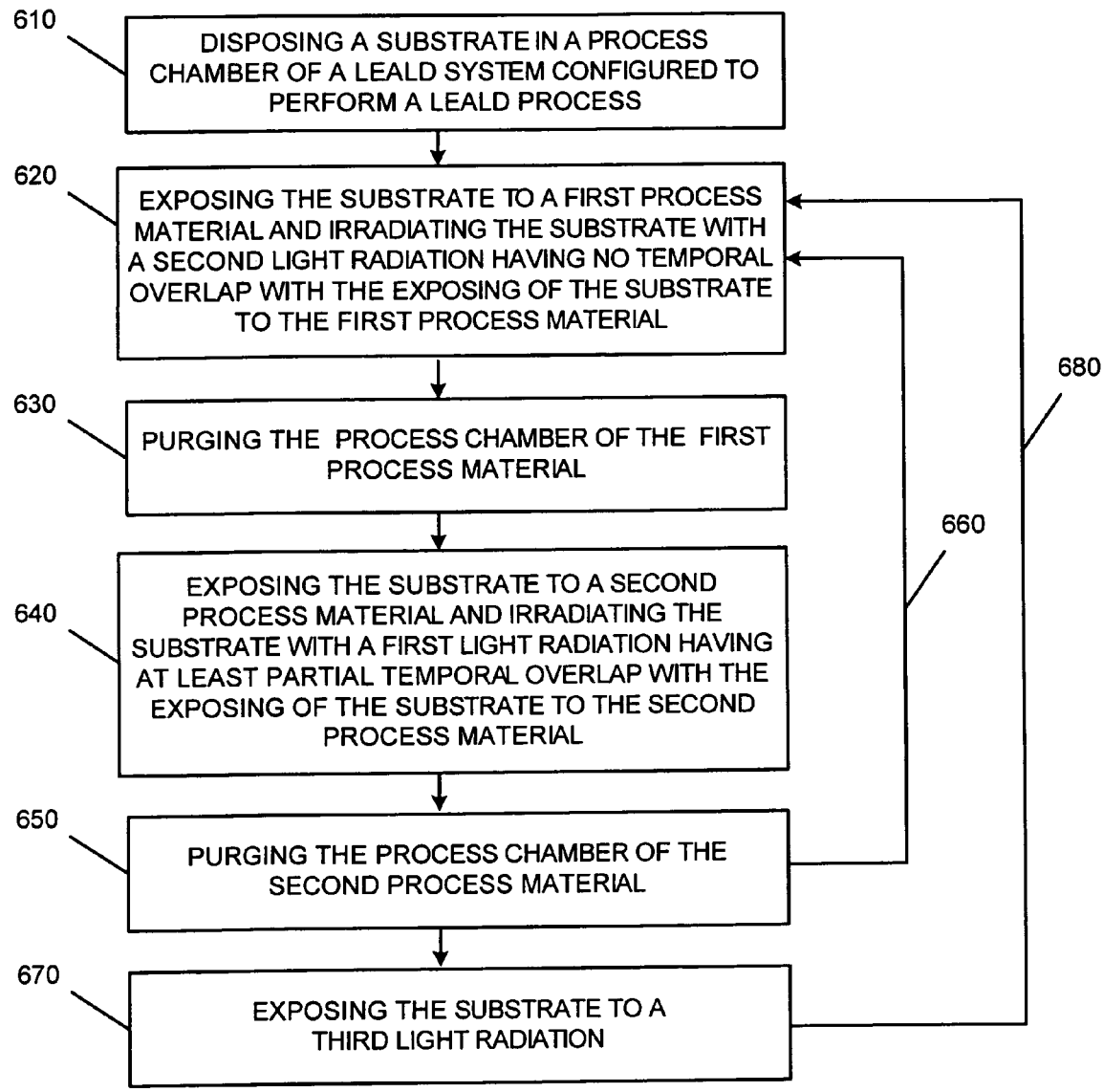

FIGS. 6A and 6B depict a timing diagram and process flow diagram for a LEALD process for forming a film on a substrate according to yet another embodiment of the invention. The timing diagram of FIG. 6A is similar to that of FIG. 5A, where time periods 601, 602, 603, 604, 604a, and 606 are similar or the same as time periods 501, 502, 503, 504, 504a, and 506, respectively. Furthermore, the process flow diagram 6B is similar to that of FIG. 5B, where steps 610, 630-680, are similar or the same as steps 510, 530-580, respectively.

Step 620 is similar to step 520, but step 620 includes exposing the substrate for a first process material and irradiating the substrate with a second light radiation having no overlap with the exposing of the substrate to the first process material. According to one embodiment of the invention, the first, second, and third light radiation may have the same wavelength range and the same power. Alternately, they may vary in wavelength range and/or in power.

According to an embodiment of the invention, steps 610-650 may be repeated any number of times as depicted by process flow arrow 660, for example between 1 and 100 times, or between 30 and 70 times. Furthermore, step 670 combined with steps 610-650, where steps 610-650 have been repeated a desired number of times, may also be repeated any number of times as depicted by process flow arrow 680, for example between 1 and 20 times, or between 2 and 10 times to form a film with a desired thickness on the substrate. The thickness of the film can, for example, be between 0.5 nm and about 20 nm, or between 1 nm and about 10 nm.

Although only certain exemplary embodiments of inventions have been described in detail above, those skilled in the art will readily appreciate that many modifications are possible in the exemplary embodiments without materially departing from the novel teachings and advantages of this invention. For example, although the process examples contained herein each include chamber purging steps. However, such purging steps are not required for the present invention. Accordingly, all such modifications are intended to be included within the scope of this invention.

What is claimed is:

1. A method for processing a substrate, comprising:
   disposing the substrate in a process chamber of a light enhanced atomic layer deposition (LEALD) system configured to perform a LEALD process; and
   depositing a film containing a metal nitride or a metal carbide film, or a combination thereof on the substrate using the LEALD process, wherein the depositing comprises:
   (a) exposing the substrate to a first process material comprising a metal containing precursor without irradiating the substrate with electromagnetic radiation at any time during the exposing the substrate to the metal containing precursor, such that the metal containing precursor is adsorbed to a surface of the substrate,
   (b) exposing the substrate to a second process material comprising a reducing agent and irradiating the substrate with a first light radiation having either no or at least partial temporal overlap with the exposing of the substrate to the second process material such that the adsorbed metal containing precursor is reduced to a material of the film to be deposited on the substrate, and
   (c) repeating steps (a) and (b) until a desired film has been deposited.

2. The method of claim 1, wherein the first light radiation comprises diffuse VUV light, UV light, visible light, or IR light, or a combination of two or more thereof.

3. The method of claim 1, wherein steps (a) and (b) are repeated between 1 and 100 times.

4. The method of claim 1, wherein steps (a) and (b) are repeated between 30 and 70 times.

5. The method of claim 1, wherein step (c) comprises depositing a film having a thickness between 0.5 nm and 20 nm.

6. The method of claim 1, wherein step (c) comprises depositing a film having a thickness between 1 nm and 10 nm.

7. The method of claim 1, wherein step (a) further comprises irradiating the substrate with a second light radiation having no temporal overlap with the exposing of the substrate to the first process material comprising the metal containing precursor, and wherein step (b) comprises exposing the substrate to a second process material comprising a reducing agent and irradiating the substrate with a first light radiation having at least partial temporal overlap with the exposing of the substrate to the second process material.

8. The method of claim 7, wherein the first and second light radiation comprise diffuse VUV light, UV light, visible light, or IR light, or a combination of two or more thereof.

9. The method of claim 7, further comprising:
   (d) exposing the substrate in the process chamber to a third light radiation following step (c), and
   (e) repeating steps (a)-(d) until the film has a desired thickness.

10. The method of claim 9, wherein the first, second, and third light radiation comprise diffuse VUV light, UV light, visible light, or IR light, or a combination of two or more thereof.

11. The method of claim 9, wherein steps (a)-(d) are repeated between 1 and 100 times.

12. The method of claim 9, wherein steps (a)-(d) are repeated between 30 and 70 times.

13. The method of claim 1, further comprising:
   (d) exposing the substrate in the process chamber to a second light radiation following step (c), and
   (e) repeating steps (a)-(d) until the film has a desired thickness.

14. The method of claim 13, wherein the first and second light radiation comprise diffuse VUV light, UV light, visible light, or IR light, or a combination of two or more thereof.

15. The method of claim 13, wherein steps (a)-(d) are repeated between 1 and 100 times.

16. The method of claim 13, wherein steps (a)-(d) are repeated between 30 and 70 times.

17. The method of claim 1, wherein the depositing comprises depositing a TaCN film and the first process material comprises TAIMATA, PDEAT, PEMAT, PDMAT, TBTDET, $Ta(NC_2H_5)(N(C_2H_5)_3$, $Ta(NC(CH_3)_3)(N(CH_3)_2)_3$, or TBTEMAT.

18. The method of claim 1, wherein the depositing comprises depositing a TaC film and the first process material comprises $Ta(\eta^5\text{-}C_5H_5)_2H_3$, $Ta(CH_2)(CH_3)$ $(\eta^5\text{-}C_5H_5)_2$, Ta($\eta^3$-C$_3$H$_5$) ($\eta^5$-C$_5$H$_5$)$_2$, Ta(CH$_3$)$_3$($\eta^5$-C$_5$H$_5$)$_2$, Ta(CH$_3$)$_4$ ($\eta^5$-C$_5$(CH$_3$)$_5$), or Ta($\eta^5$-C$_5$(CH$_3$)$_5$)$_2$H$_3$.

19. The method of claim 1, wherein the second process material comprises H$_2$, NH$_3$, N$_2$H$_4$, NH(CH$_3$)$_2$, N$_2$H$_3$CH$_3$, B$_2$H$_6$, SiH$_4$, or Si$_2$H$_6$, or a combination of two or more thereof.

20. The method of claim 1, further comprising purging the process chamber after each of steps (a) and (b).

21. The method of claim 20, wherein the purging comprises flowing a purge gas through the process chamber, wherein the purge gas comprises a noble gas, N$_2$, or H$_2$, or a combination of two or more thereof.

22. The method of claim 1, wherein:
   step (a) comprises exposing the substrate to a metal containing precursor comprising a metal as a main component of the film to be deposited, and
   step (b) comprises exposing the substrate to a second process material comprising a reduction material that does not include a main component of the film to be deposited.

23. The method of claim 1, wherein the depositing comprises depositing said film on a substrate feature having a sidewall.

24. The method of claim 23, wherein the deposition comprises depositing said film on a wiring trench or via.

25. The method of claim 24, wherein said wiring trench or via is a high-aspect ratio feature.

26. The method of claim 1 wherein said depositing comprises depositing a back end of line (BEOL) film.

27. A method for processing a substrate, comprising:
   disposing the substrate in a process chamber of a light enhanced atomic layer deposition (LEALD) system configured to perform a LEALD process; and
   depositing a TaCN or TaC film on the substrate using the LEALD process, wherein the depositing comprises:
   (a) exposing the substrate to a first process material containing tantalum without irradiating the substrate with electromagnetic radiation at any time during the exposing the substrate to the material containing tantalum, such that the material containing tantalum is adsorbed to a surface of the substrate,
   (b) purging the process chamber of the first process material,
   (c) exposing the substrate to a second process material comprising H$_2$ and irradiating the substrate with a first light radiation having at least partial temporal overlap with the exposing of the substrate to the second process material such that the adsorbed material containing tantalum is reduced to a material of the film to be deposited on the substrate,
   (d) purging the process chamber of the second process material, and
   (e) repeating steps (a)-(d) until the TaCN or TaC film has a thickness between 1 nm and 10 nm.

28. The method of claim 27, wherein the depositing comprises depositing a TaCN film and the first process material comprises TAIMATA, PDEAT, PEMAT, PDMAT, TBTDET, Ta(NC$_2$H$_5$)(N(C$_2$H$_5$)$_2$)$_3$, Ta(NC(CH$_3$)$_2$C$_2$H$_5$)(N(CH$_3$)$_2$)$_3$, Ta(NC(CH$_3$)$_3$)(N(CH$_3$)$_2$)$_3$, or TBTEMAT.

29. The method of claim 27, wherein the depositing comprises depositing a TaC film and the first process material comprises Ta($\eta^5$-C$_5$H$_5$)$_2$H$_3$, Ta(CH$_2$)(CH$_3$)($\eta^5$-C$_5$H$_5$)$_2$, Ta($\eta^3$-C$_3$H$_5$) ($\eta^5$-C$_5$H$_5$)$_2$, Ta(CH$_3$)$_3$($\eta^5$-C$_5$H$_5$)$_2$, Ta(CH$_3$)$_4$ $\eta^5$-C$_5$(CH$_3$)$_5$), or Ta($\eta^5$-C$_5$(CH$_3$)$_5$)$_2$H$_3$.

30. A method for processing a substrate, comprising:
   disposing the substrate in a process chamber of a diffuse light enhanced atomic layer deposition (LEALD) system configured to perform a LEALD process; and
   depositing a film on the substrate in a back end of line (BEOL) process using the LEALD process, wherein the depositing comprises:
   (a) exposing the substrate to a first process material comprising a metal containing precursor without irradiating the substrate with electromagnetic radiation at any time during the exposing the substrate to the metal containing precursor, such that the metal containing precursor is adsorbed to a surface of the substrate,
   (b) exposing the substrate to a second process material comprising a reducing agent and irradiating the substrate with a first diffuse light radiation having either no or at least partial temporal overlap with the exposing of the substrate to the second process material such that the adsorbed metal containing precursor is reduced to a material of the film to be deposited on the substrate, and
   (c) repeating steps (a) and (b) a desired film has been deposited.

* * * * *